(12) United States Patent
Fraser et al.

(10) Patent No.: US 7,759,774 B2
(45) Date of Patent: *Jul. 20, 2010

(54) SHIELDED STRUCTURES TO PROTECT SEMICONDUCTOR DEVICES

(75) Inventors: David Fraser, Danville, CA (US); Brian Doyle, Portland, OR (US)

(73) Assignee: Intel Corporation, Santa Clara, CA (US)

(*) Notice: Subject to any disclaimer, the term of this patent is extended or adjusted under 35 U.S.C. 154(b) by 182 days.

This patent is subject to a terminal disclaimer.

(21) Appl. No.: 11/206,435

(22) Filed: Aug. 17, 2005

(65) Prior Publication Data

US 2006/0033204 A1   Feb. 16, 2006

Related U.S. Application Data

(60) Continuation of application No. 10/637,240, filed on Aug. 7, 2003, now Pat. No. 6,949,476, which is a continuation of application No. 09/821,323, filed on Mar. 28, 2001, now Pat. No. 6,696,369, which is a division of application No. 09/540,072, filed on Mar. 31, 2000, now Pat. No. 6,400,015.

(51) Int. Cl.
*H01L 23/28* (2006.01)
*H01L 23/02* (2006.01)
*G21F 3/00* (2006.01)

(52) U.S. Cl. .................. 257/659; 257/660; 257/666; 257/686; 257/698; 257/E23.114; 257/E23.126; 257/E23.136; 257/E23.189; 250/515.1; 174/50; 174/50.56; 174/50.6; 174/262

(58) Field of Classification Search ................. 257/659, 257/660, 666, 696, E23.114, E23.126, E23.136, 257/E23.189; 250/515.1; 174/50, 50.56, 174/50.6, 262
See application file for complete search history.

(56) References Cited

U.S. PATENT DOCUMENTS

| | | | |
|---|---|---|---|
| 4,266,090 A | | 5/1981 | Scherer |
| 4,541,035 A | * | 9/1985 | Carlson et al. ............. 361/792 |
| 5,315,486 A | * | 5/1994 | Fillion et al. ............. 361/795 |
| 5,340,370 A | | 8/1994 | Cadien et al. |
| 5,402,004 A | * | 3/1995 | Ozmat ....................... 257/717 |
| 5,592,391 A | | 1/1997 | Muyshondt et al. |
| 5,760,455 A | | 6/1998 | Hierold et al. |
| 5,763,824 A | | 6/1998 | King et al. |
| 5,880,403 A | * | 3/1999 | Czajkowski et al. ........ 174/387 |
| 6,022,787 A | | 2/2000 | Ma |

(Continued)

OTHER PUBLICATIONS

Electricity, Physics Demonstrations—Electricity, downloaded from http://sprott.physics.wisc.edu/demobook/chapter4.html, 16 pages, Dec. 15, 1999.

*Primary Examiner*—Dao H Nguyen
(74) *Attorney, Agent, or Firm*—Blakely, Sokoloff, Taylor & Zafman LLP

(57) ABSTRACT

An apparatus on a wafer, comprising; a first metal layer of a wall, a second metal layer of the wall, a third metal layer of the wall comprising; one or more base frames, a fourth metal layer of the wall comprising; one or more vertical frame pairs each on top of the one or more base frames and having a pass-thru therein, a fifth metal layer of the wall comprising; one or more top frames each over the pass-thru; and a metal lid.

20 Claims, 15 Drawing Sheets

U.S. PATENT DOCUMENTS

| | | |
|---|---|---|
| 6,166,403 A | 12/2000 | Castagnetti et al. |
| 6,297,072 B1 | 10/2001 | Tilmans et al. |
| 6,376,769 B1 * | 4/2002 | Chung ........................ 174/524 |
| 6,455,864 B1 * | 9/2002 | Featherby et al. ........ 250/515.1 |
| 6,495,914 B1 * | 12/2002 | Sekine et al. ................ 257/723 |
| 6,696,369 B2 * | 2/2004 | Fraser et al. ................. 438/764 |
| 6,720,493 B1 * | 4/2004 | Strobel et al. ................ 174/388 |
| 2003/0017646 A1 | 1/2003 | Sridharan et al. |

* cited by examiner

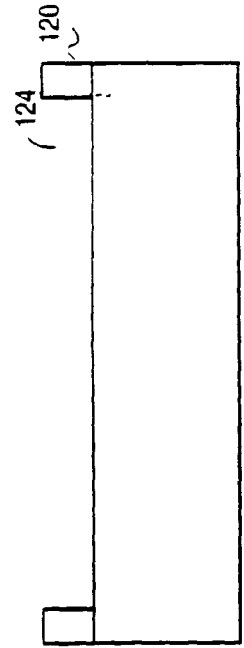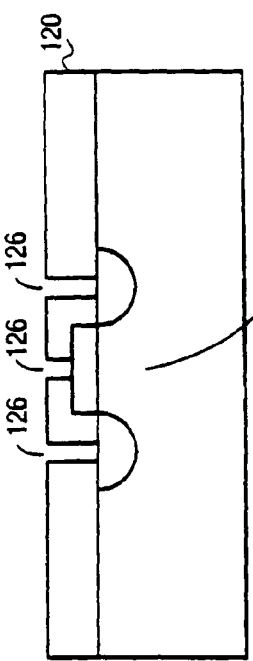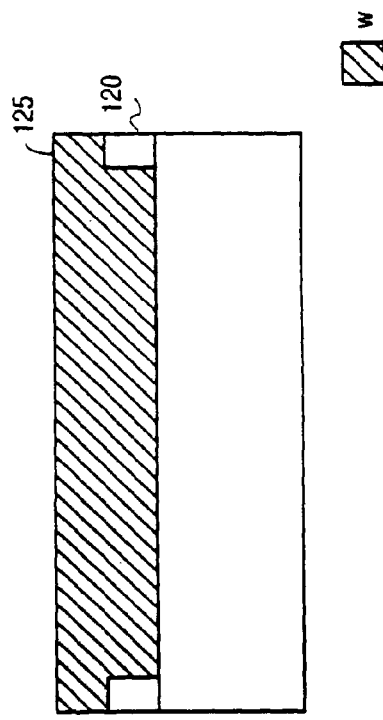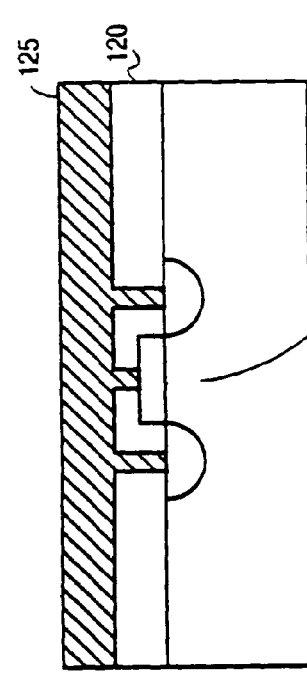

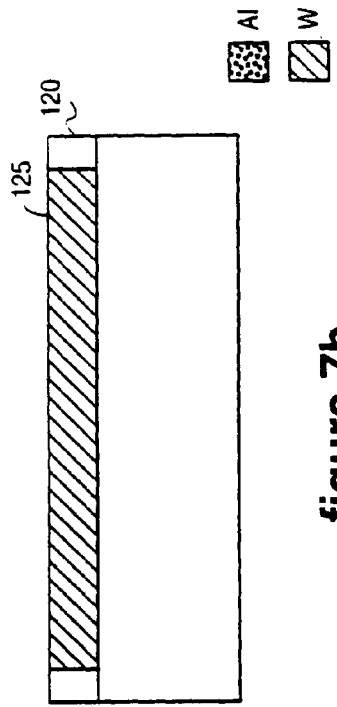
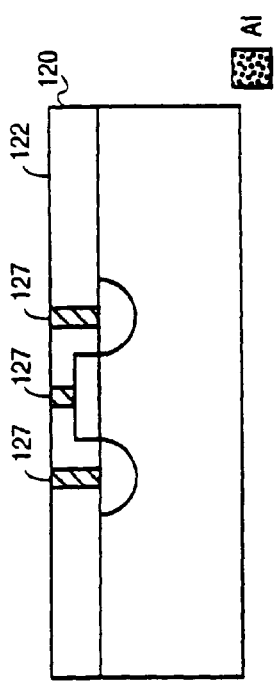
figure 7a
figure 7b
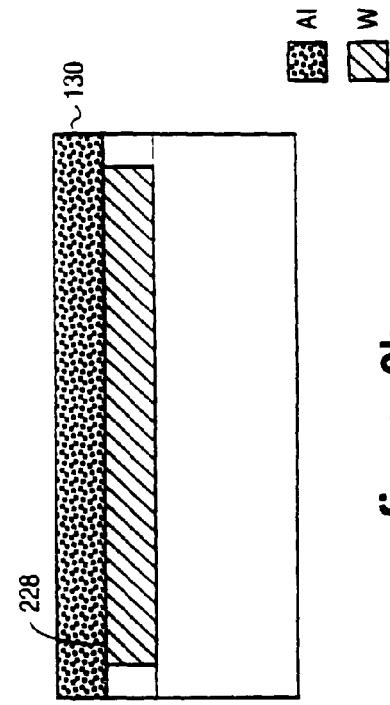
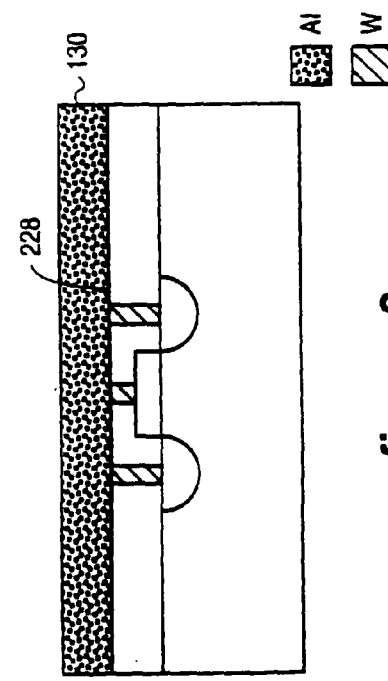
figure 8a
figure 8b

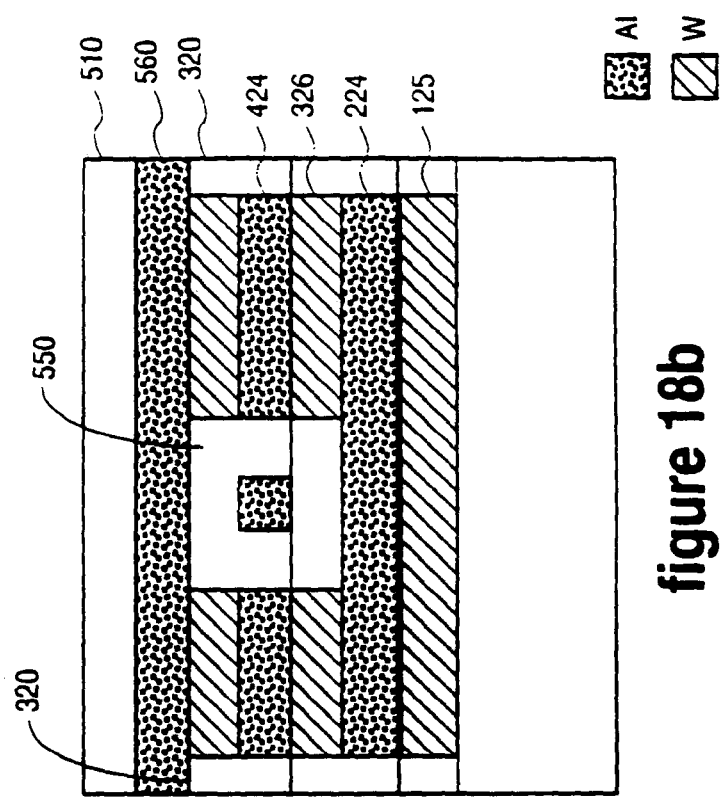
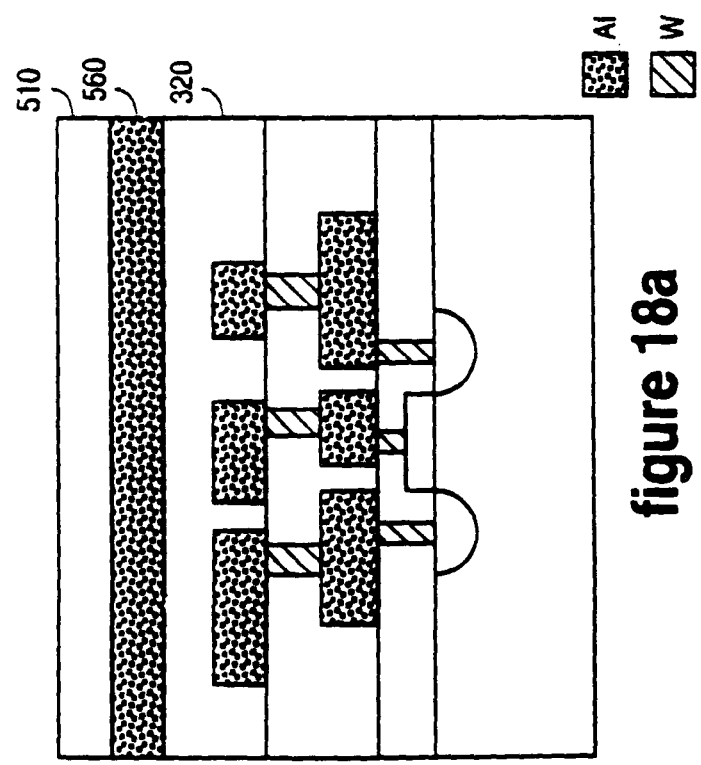
figure 18b
figure 18a

SHIELDED STRUCTURES TO PROTECT SEMICONDUCTOR DEVICES

The present patent application is a continuation of application Ser. No. 10/637,240 filed Aug. 7, 2003 now U.S. Pat. No. 6,949,476, which is a Continuation of patent application Ser. No. 09/821,323 filed Mar. 28, 2001, now U.S. Pat. No. 6,696,369, which is a divisional of patent application Ser. No. 09/540,072 filed Mar. 31, 2009, now U.S. Pat. No. 6,400,015.

BACKGROUND OF THE INVENTION

1. Field of the Invention

The present invention relates to the field of semiconductor device fabrication, and more specifically to a method and structure for constructing a structure using semiconductor device fabrication methods that shields semiconductor devices.

2. Discussion of Related Art

Today integrated circuits are made up of literally millions of active and passive devices such as transistors, capacitors, and resistors. In order to improve overall chip performance, some devices may need to be shielded from the electromagnetic interference (EMI) from adjacent devices, from heat, and from light.

BRIEF DESCRIPTION OF THE DRAWINGS

FIGS. 5a & b are illustrations of via openings and a first slot;

FIGS. 6a & b are illustrations of a first conducting layer;

FIGS. 7a & b are illustrations of a deposit of a first conducting layer and a first layer of a wall;

FIGS. 8a & b are illustrations of a metal one layer;

FIGS. 18a & b are illustrations of a barrier coating on the lid;

DETAILED DESCRIPTION OF THE PRESENT INVENTION

Figure 1:
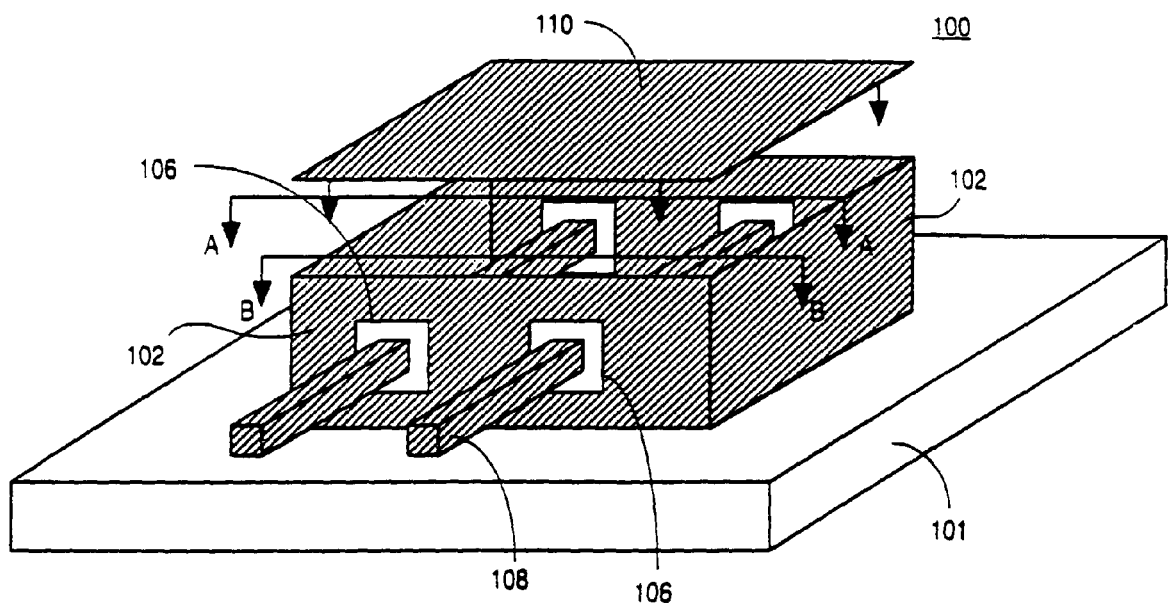
FIG. 1 is an illustration of a Faraday cage with insulated pass-thrus.

A novel device structure and method for shielding a region on a semiconductor is described. In the following description numerous details are set forth such as specific materials and processes in order to provide a thorough understanding of the present invention. In other instances, well known semiconductor processing techniques and machinery have not been set forth in detail to avoid obscuring the present invention.

The present invention is a novel device structure and method for shielding individual or a selection of semiconductor devices from conductive and/or radiated energy. Such as, for example, electromagnetic interference (EMI) from radiation originating outside the semiconductor or from adjacent devices on the semiconductor. The present invention may be also used to direct thermal energy relative to a semiconductor, or to shield a semiconductor from light.

In an embodiment, a Faraday cage is constructed on a silicon substrate, and encloses one or more semiconductor devices within a structure of metal. The semiconductor devices having input/output leads or pass-thrus that pass through the Faraday cage walls at one or more insulated locations.

The embodiment provides that interconnects and vias both inside and outside the disclosed Faraday cage may also be constructed in the same layers used to construct the Faraday cage.

To construct the Faraday cage with insulated pass-thrus, vias and interconnects, alternating layers of tungsten (W) and aluminum (Al) are used. The use of tungsten (conductive metal) will fill in via openings between interconnects to create plugs or filled vias. This tungsten layer will add metal layers to the Faraday cage wall(s) at the same time. Alternating with the tungsten layers, interconnects are etched from layers of aluminum or aluminum alloy. As with the tungsten layers, each aluminum layer will also add a layer in constructing the walls of the Faraday cage. Left within layers of the metal Faraday cage walls are pieces of dielectric material that will make up the insulation framework (frame) around each pass-thru. This insulation surrounds or frames each pass-thru lead at the point where it passes through the metal Faraday cage wall. For each pass-thru insulation or frame construction, one metal layer will have one horizontal block (base frame), the next metal layer will have one pair of vertical bars (vertical frame pairs), and finally the insulation will be complete with the next layer addition of another horizontal bar (top frame). However it is possible for multiple insulated pass-thrus to share common frame components.

The process of depositing layers of dielectric and metal, positive or negative photoresist and etching the layers to form vias and interconnects is well understood. In addition, at the same time for this embodiment, trenches (slots) will be etched in dielectric around the semiconductor device(s) to be enclosed by the Faraday cage. The slots will be filled with tungsten. Alternating the tungsten layers are layers of aluminum. These will be etched to add more layers to the Faraday cage walls and at the same time construct the interconnects. Finally a last metal layer will completely cover the area enclosed by the Faraday cage wall(s) to act as a roof or lid over the walls.

The following embodiment will describe the process of joint fabrication of the Faraday cage, enclosing with metal, one or more semiconductor devices having insulated pass-thrus (input/output leads or conductors) and layers of interconnects joined by vias to the semiconductor devices.

Referring to FIG. 1, cross-sections A-A and B-B will be shown as figure a and figure b designations respectively in later illustrations. These cross-sections (A-A & B-B) appear throughout many of the figures to show a simultaneous construction of the Faraday cage walls 102 (B-B) with the vias (shown after FIG. 2) (A-A) and the interconnects 108 (A-A). Although FIG. 1 shows the construction of two pass-thru leads (pass-thrus) 108 and insulators 106 at the front and back walls 102, the later figures only illustrate construction of a single pass-thru 108 and a single insulator 106. This is done for clarity, however it is to be understood that any number of pass-thrus 108 and insulators 106 may be fabricated in a Faraday cage 100 at different levels.

Figure 2:
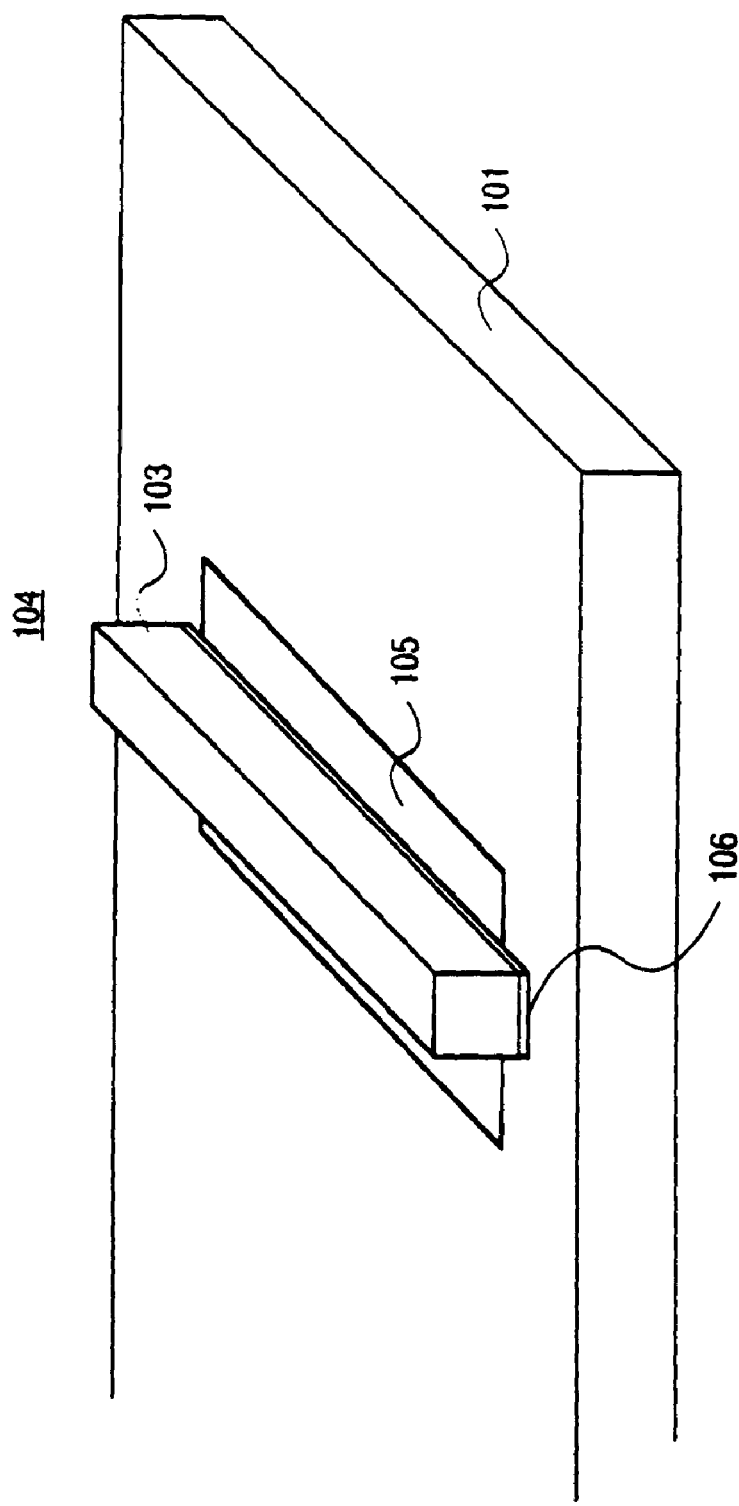
FIG. 2 is an illustration of a semiconductor device on a silicon wafer.

As shown in FIG. 2, prior to beginning depositions for Faraday cage 100 (FIG. 1) construction, the semiconductor device 104 such as an MOS transistor having a gate 103 with a gate oxide beneath 106, and a pair of source and drain regions 105, have been constructed on a wafer substrate (substrate) 101. The substrate may be made from such materials as silicon (Si), gallium arsenide (GaAs), or one of the silicon-on-insulator (SOI) materials such as silicon-on-sapphire (SOS) or silicon-on-diamond. The transistor may link with other transistors to function in a variety of tasks such as a resister, capacitor, memory storage device, sense amp, or an input/output buffer.

Figure 3B:
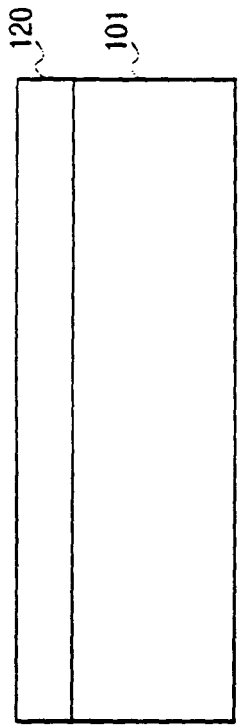
FIGS. 3a & b are illustrations of a deposition of a first dielectric layer onto a silicon substrate and a semiconductor device.
Figure 3A:
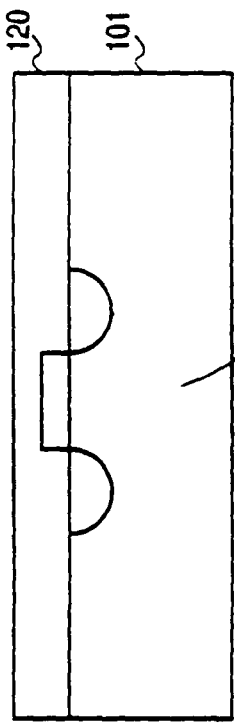

Turning to FIGS. 3a & b, a first coating of the dielectric 120 (first dielectric layer) is deposited as an insulative layer over the substrate 101 and the previously fabricated semiconductor device 104. The dielectric material for this embodiment is silicon dioxide ($SiO_2$) but may also be silicon nitride ($Si_3N_4$), phosphorus-doped silicon oxide (PSG), or boron/phosphorus-doped silicon oxide (BPSG).

Figure 4B:
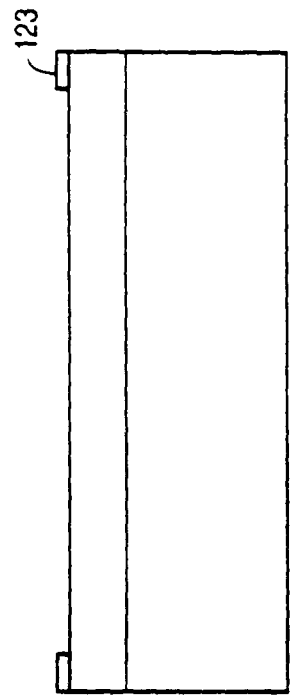
FIGS. 4a, b are illustrations of a photoresist layer on the first layer dielectric.
Figure 4A:
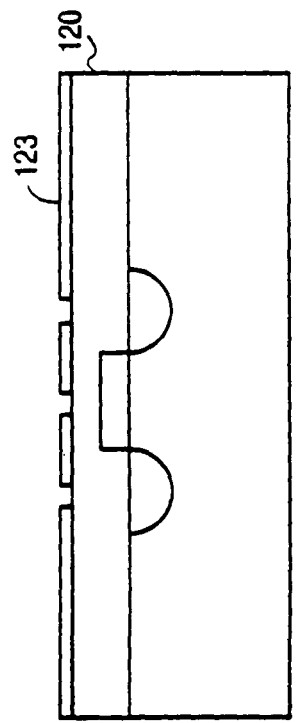

A process known as patterning is next performed. This involves applying a photoresist coating over the substrate and then using well known photolithography steps such as masking, exposing, and developing, to form a patterned photoresist layer. The underlying material is then etched in alignment with the patterned photoresist layer. As shown in FIGS. 4a & b, the first dielectric layer 120 is coated with the photoresist layer 123 within which is formed a pattern 123. The pattern 123 in the photoresist is reacted and the non-reacted photoresist material is then removed.

The next step is an etch of the first dielectric layer 120 that follows the shape of the photoresist pattern 123. With this etch, the photoresist layer protects the dielectric layer 120 beneath from the etch operation. Referring to FIG. 5a, first via openings 126 are etched within the first dielectric layer 120. These first via openings 126 are etched through the first dielectric layer 120 exposing a portion of the semiconductor 104 surface. Turning now to FIG. 5b, at the same time a first slot 124 is etched in the first dielectric layer 120, and surrounds the semiconductor device(s) 104 (FIG. 5a) to be EMI shielded. The first slot 124 begins the formation of the Faraday cage walls 102 (FIG. 1). This etch and subsequent etches may be accomplished by a variety of methods such as with a wet chemical (wet-chem) or by one of the plasma etches such as a reactive ion etch.

Next, but not shown, a barrier coating may be applied to the etched dielectric 120 surface to improve adhesion between a metal coating to be next applied and the dielectric 120. This coating may be titanium or titanium nitride material. This barrier coating may be used on any dielectric surface when a metal coating will be applied over the dielectric.

Now, a fill layer of a material (first conducting layer) 125 is deposited as shown in FIGS. 6a & b. Turning now to FIGS. 7a & b, there is seen the first conducting layer 125 after it has been polished back to the first dielectric layer 120. This polish is accomplished by a chemical etch and a chemical-mechanical polish (CMP) may be used prior to the chemical etch. The first conducting layer 125 has filled in the via openings 126 (FIG. 5a) forming vias 127 (filled vias, via plugs, or plugs) and filled in the first slot 124 (FIG. 5b) to form a first layer of wall 128 in constructing the Faraday cage walls 102 (FIG. 1). The conducting material used to fill in the vias for this embodiment is tungsten (W) but may be another metal such as aluminum (Al) or a non-metal such as polysilicon (Si).

Referring now to FIGS. 8a & b, a first metal layer or metal one (M1) 130 of aluminum (Al) is deposited over the dielectric top surface 228. While the metal layers for this embodiment are made of aluminum, other well known metals used for interconnects, such as copper, may be used.

Figure 9A:
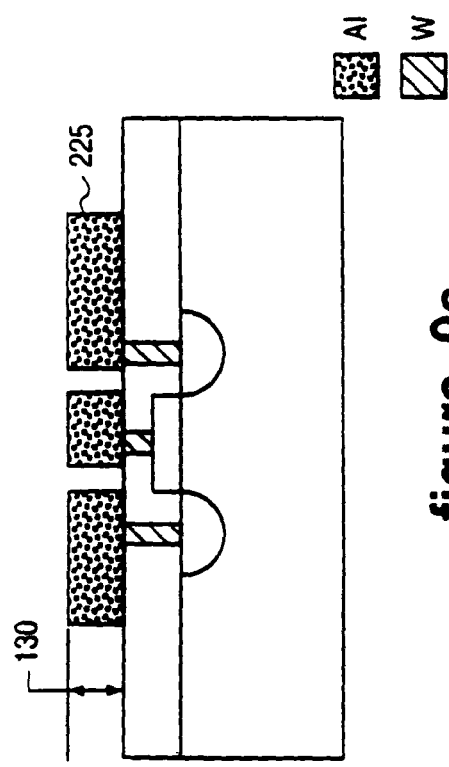
FIGS. 9a & b are illustrations of a first interconnect layer and a second layer of the wall.
Figure 9B:
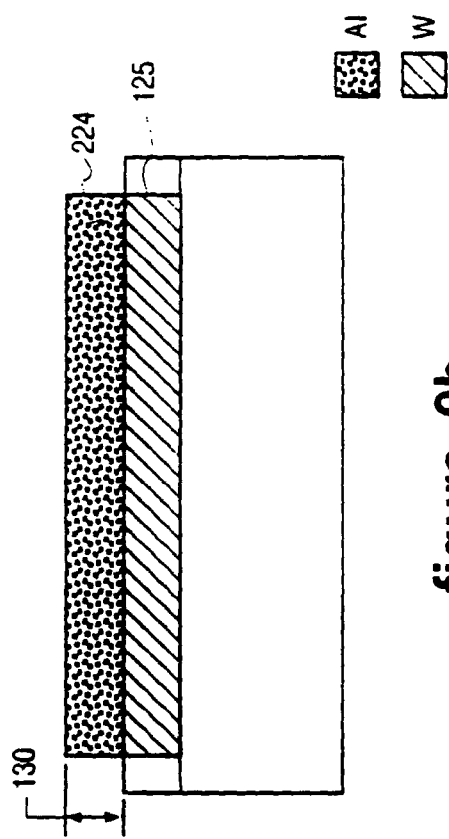

Turning to FIGS. 9a & b are displayed the after-patterning results. A first layer of interconnects (first interconnects) 225 are formed in the M1 130. At the same time with M1 130, a second layer of the wall 224 is placed over the first layer of the wall 125 that is forming the overall wall structure 102 (FIG. 1).

Figure 10A:
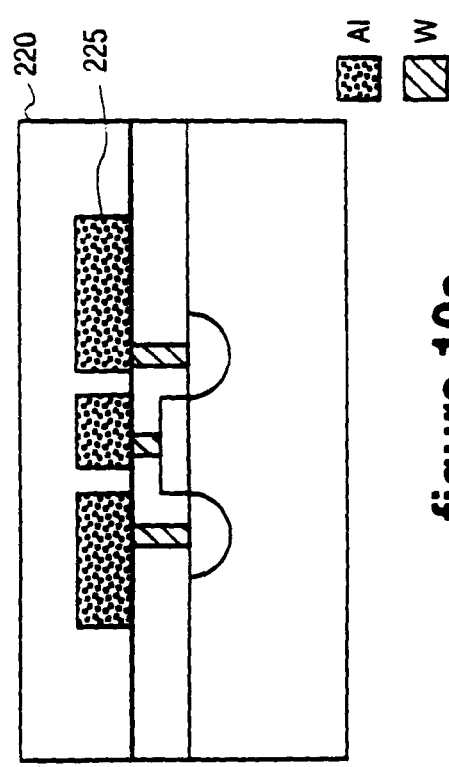
FIGS. 10a & b are illustrations of a second dielectric layer.
Figure 10B:
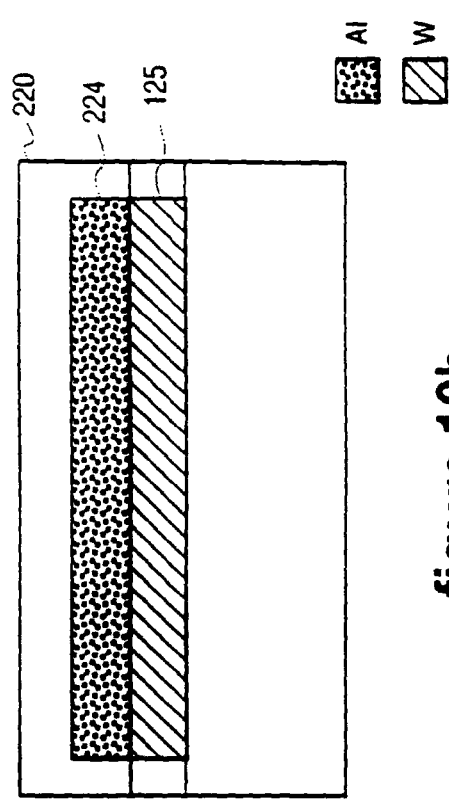

Referring now to FIGS. 10a & b, there is seen a deposit of a second dielectric ($SiO_2$) layer 220. This second dielectric layer 220 fills in around the second layer of the wall 224 construction and the first layer of interconnects 225.

Figure 11A:
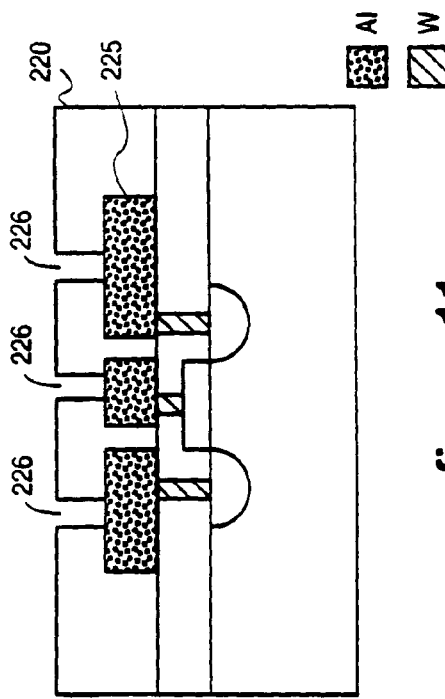
FIGS. 11a & b are illustrations of via a second dielectric layer with via openings, a third wall slot, and a base frame.
Figure 11B:
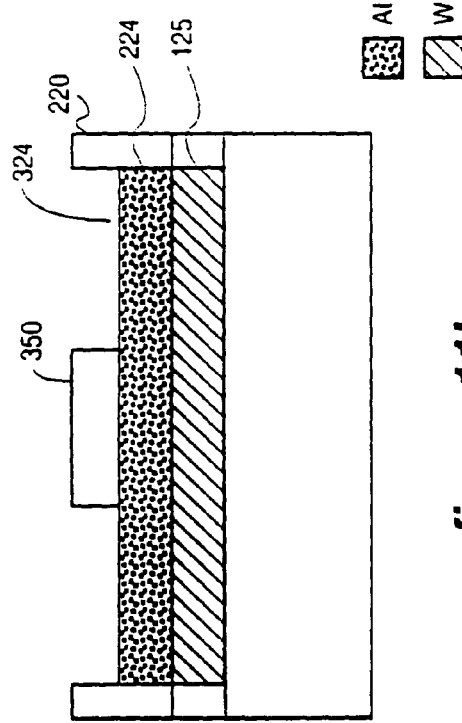

The second dielectric (SiO2) layer 220 is patterned (photoresist+etch) as described above but not shown here. The results of the patterning is displayed in FIGS. 11a & b. Via openings 226 are etched until surfaces on the first interconnects 225 are exposed. In addition, a second slot 324 is constructed within the second dielectric layer 220 and positioned above the first and second layers of wall 125, 224. At a selected location, the second slot 324 construction leaves a base frame 350 within, of dielectric (from second $SiO_2$ layer 220), to begin construction of the pass-thru insulation 106 (FIG. 1).

Figure 12A:
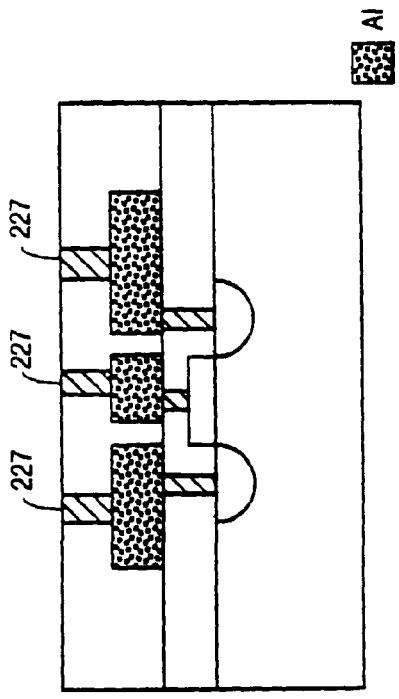
FIGS. 12a & b are illustrations a second conductive layer deposited.
Figure 12B:
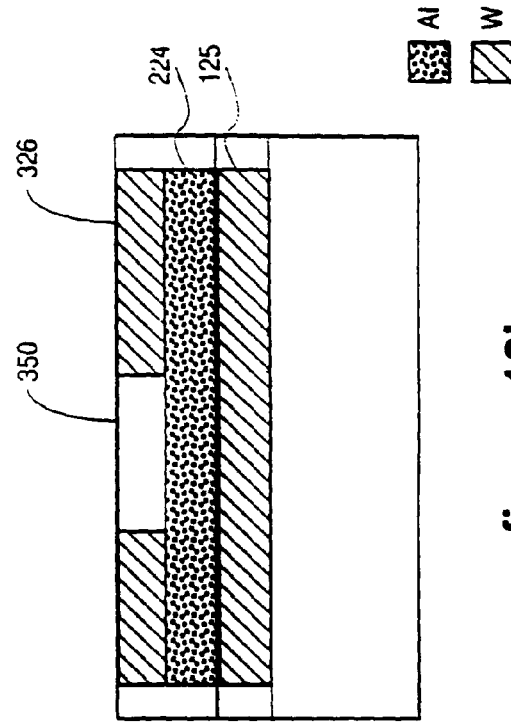
Figure 13B:
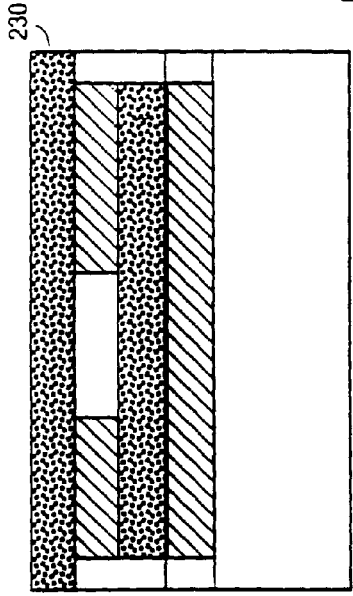
FIGS. 13a & b are illustrations of a metal two layer deposited.

Referring now to FIGS. 12a & b, a second fill layer of tungsten (second conducting material) is deposited and then polished back to the second dielectric layer 220. After polish, a tungsten filled third layer of the wall 326 remains over the previously constructed walls 125, 224. At the same time, vias 227 are created. In addition, the tungsten layer 326 fills in around the base frame 350.

Figure 13A:
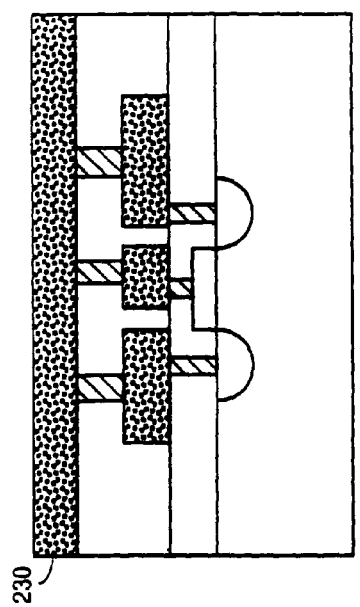

FIGS. 13a & b show a deposit of a second metal layer or metal two (M2) 230 of aluminum. After deposition, the M2 230 is patterned as described above.

Figure 14B:
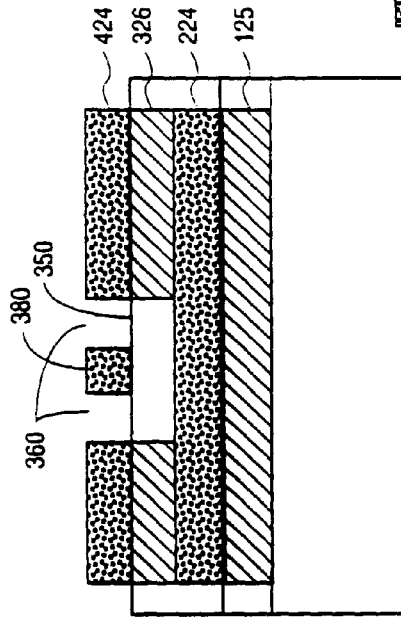
FIGS. 14a & b are illustrations of a second layer interconnect, a fourth layer of the wall, vertical frame slots, and a pass-thru.
Figure 14A:
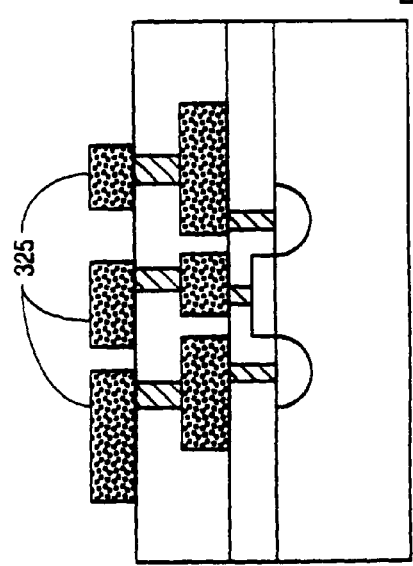
Figure 15B:
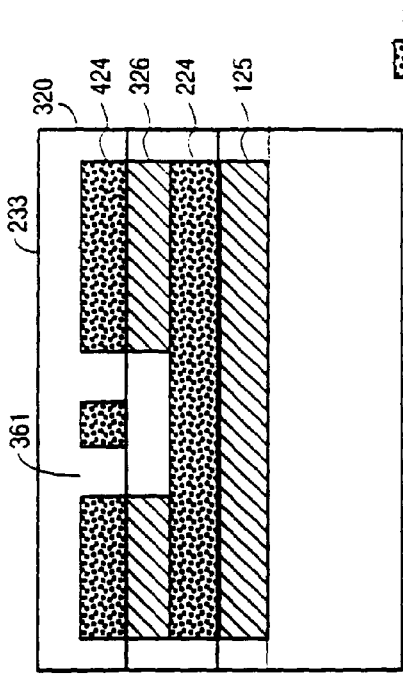
FIGS. 15a & b are illustrations of a third dielectric layer.

Turning now to FIGS. 14a & b, after etching, a second layer of interconnects 325 (second interconnects) are formed from M2. At the same time, a fourth layer of the wall 424 is formed from M2 that is positioned over the previously constructed layers of wall 125, 224, 326. Additionally, within the fourth layer of the wall 424 there remain two vertical spaces (vertical frame slots) 360 over each base frame 350. Above the base frame 350 and between the two vertical frame slots 360 passes the pass-thru 380 from the interconnects 325 to circuitry outside the partially constructed wall 102 (FIG. 1).

At this point (FIGS. 14a & b), there is constructed in alternating tungsten and aluminum, four layers of the partially constructed wall 125, 224, 326, 424. The metal (Al) pass-thru lead 380 connects from the second interconnect 325 and passes through the partially constructed insulator 350, 360 to outside circuitry (not shown).

Figure 16B:
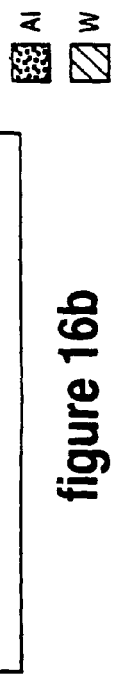
FIGS. 16a & b are illustrations of a fifth slot, and a top frame.
Figure 15A:
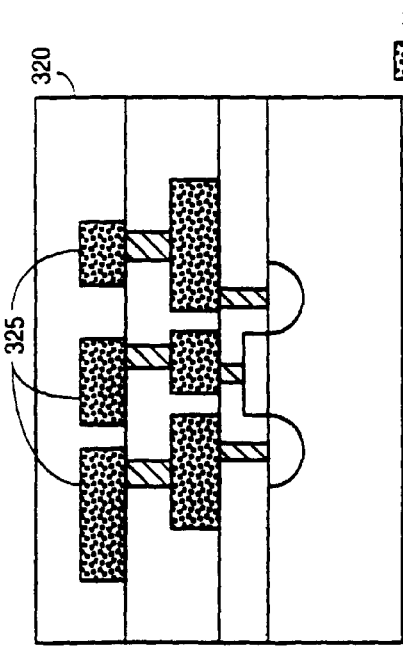

Referring now to FIGS. 15a & b, a third dielectric (SiO$_2$) layer 320 is deposited. The third SiO$_2$ layer 320 fills in the vertical frame slots 360 (FIG. 14b) to form the vertical frame pairs 361 and later the top frame 550 (shown in FIG. 16b later) of the insulator 106 (FIG. 1).

Figure 16A:
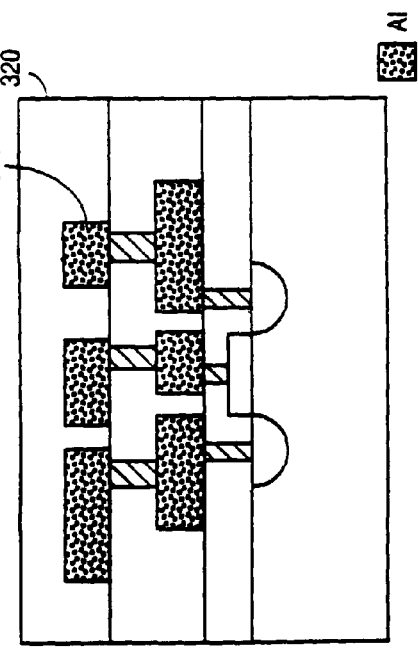

The next patterning operation is not shown but uses the techniques described above with the results shown in FIGS. 16 a & b. The third dielectric 320 layer is patterned to form a third slot 524 above the previous layers of wall 125, 224, 326, 424. Within the third slot 524 is formed the top frame 550 (SiO$_2$) over the vertical frame pairs 361 (SiO$_2$). The pass-thru is now enclosed with insulation (SiO$_2$) at the wall 125, 224, 326, 424. In addition, via openings if needed may be created that expose surfaces on the interconnects 325 beneath.

Figure 17B:
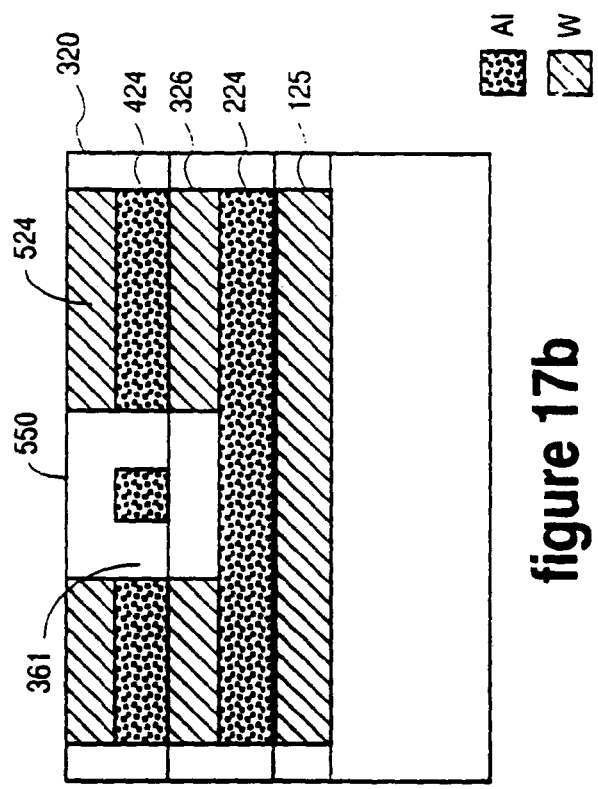
FIGS. 17a & b are illustrations of a third conductive layer completing a fifth layer of the wall.
Figure 17A:
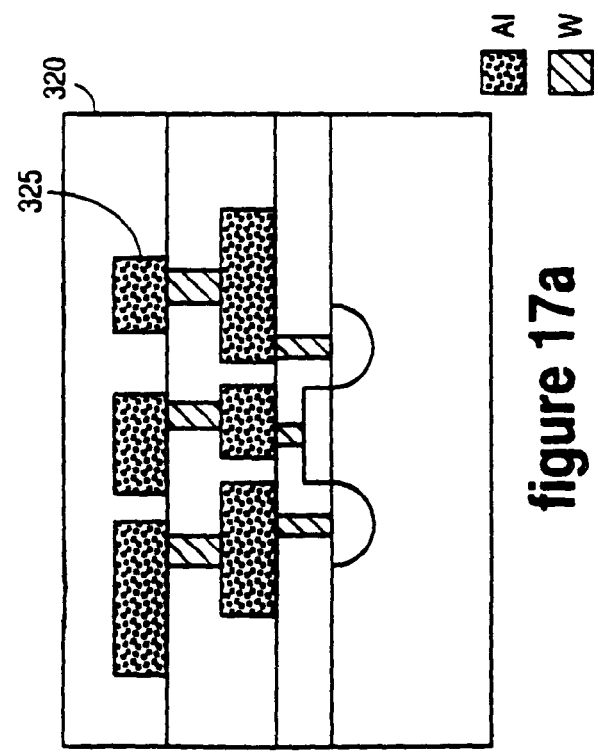

Turning now to FIGS. 17a & b, a third fill layer of tungsten (third conducting layer) (not shown) is deposited and then polished back to the third dielectric layer 320. The third fill layer fills in the third slot 524 (FIG. 16b) to form the fifth layer of the wall.

Referring now to FIGS. 18 a & b, a metal layer (M3) 330 of aluminum is deposited to form the lid 560 to complete the enclosure of the semiconductor(s) (not shown). The ML3 330 may be patterned (not shown) to shape the lid 560 or add other interconnect circuitry (not shown) and completes the basic construction of the Faraday cage 100 (FIG. 1). The lid 560 now covers the walls 102 (FIG. 1) and the entire area contained within the walls 102 (FIG. 1). Afterward, a last coating of dielectric 510 may be deposited to place a barrier coating or sealant on the lid 560.

Figure 19B:
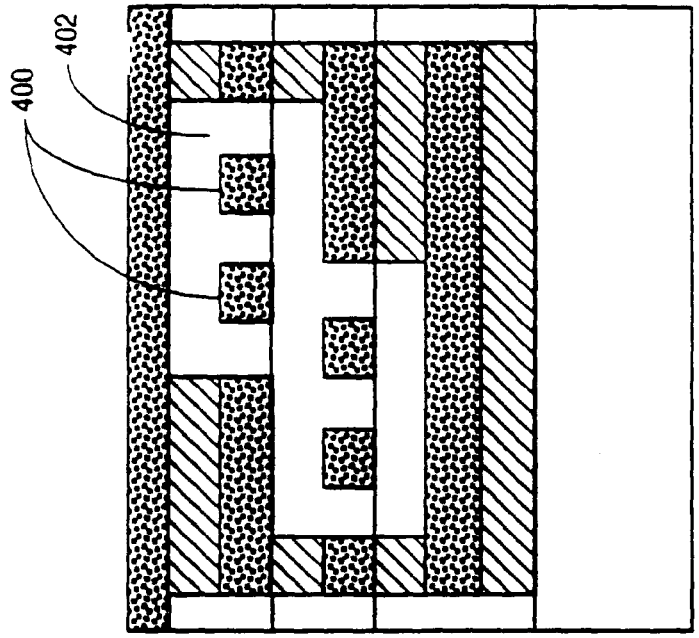
FIGS. 19a & b is an illustration of another embodiment having further layering.
Figure 19A:
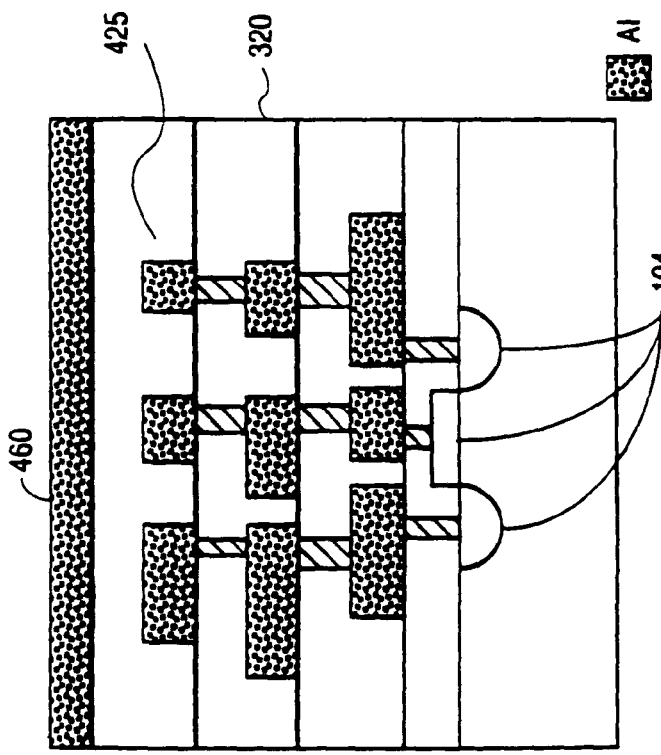

Referring to FIGS. 19a & b, there is shown an embodiment having more layers added to create another interconnect layer 425 and vias not shown here may be fabricated connecting the lid 460 to other interconnects below. There is also seen two pair of insulated pass-thrus 400. Here, the two pair of insulated pass-thrus 400 are constructed on differing layers or levels. In this illustration, the individual insulated pass-thrus 400 and pass-thru pairs 400 are separated from each other by dielectric material 402.

Figure 20:
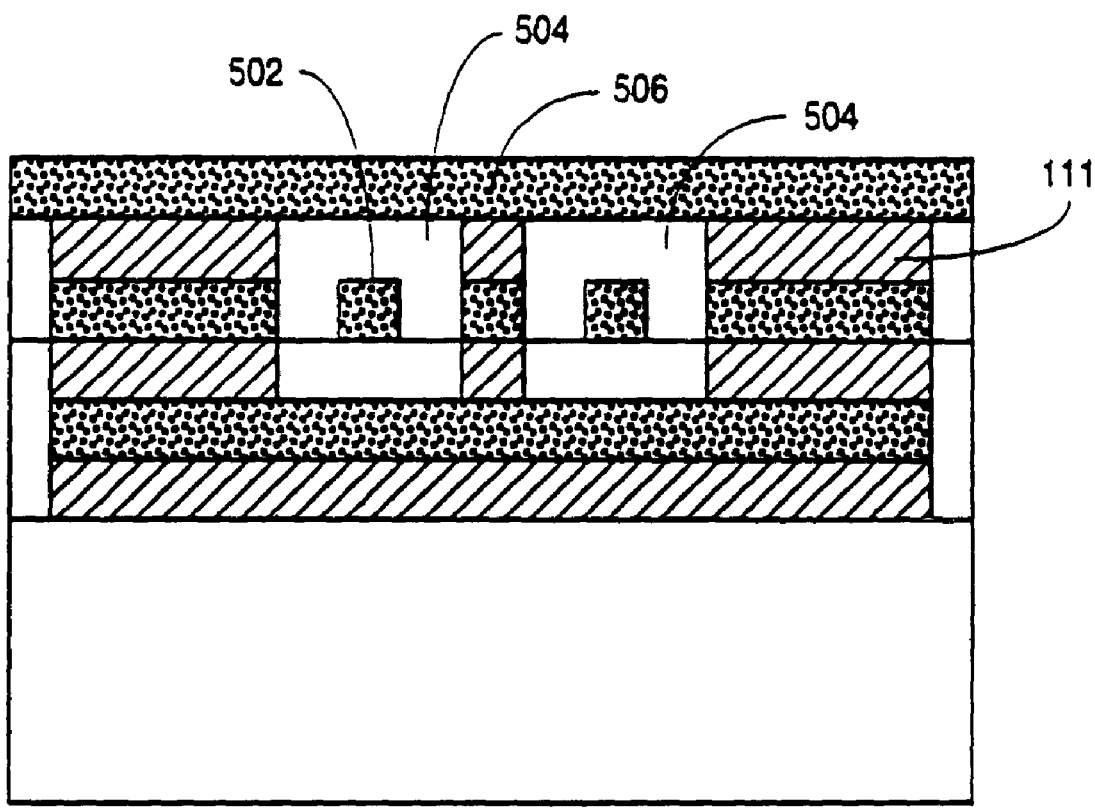
FIG. 20 is an illustration another embodiment having pairs of insulated pass-thrus.

Turning to FIG. 20 is shown a pair of insulated pass-thrus 502 separated by both dielectric material 504 and metal material 506.

Figure 21:
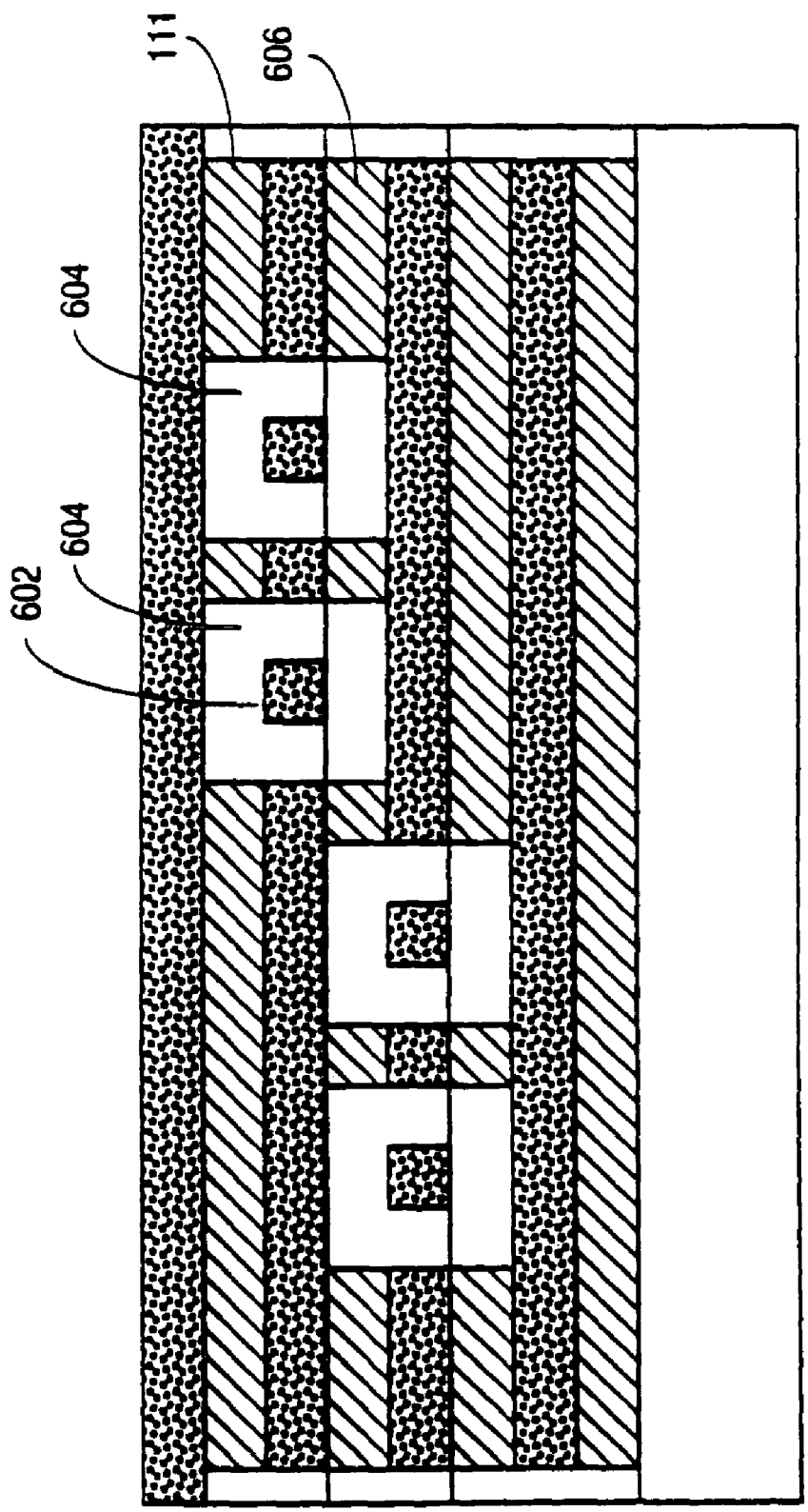
FIG. 21 is an illustration of another embodiment having two pair of insulated pass-thrus.

Referring to FIG. 21 is seen two pair of insulated pass-thrus 604 each on a different level and separated within each insulated pass-thru pair 604 and between pass-thru pairs 604 by both dielectric 604 and metal 606 material.

Figure 22:
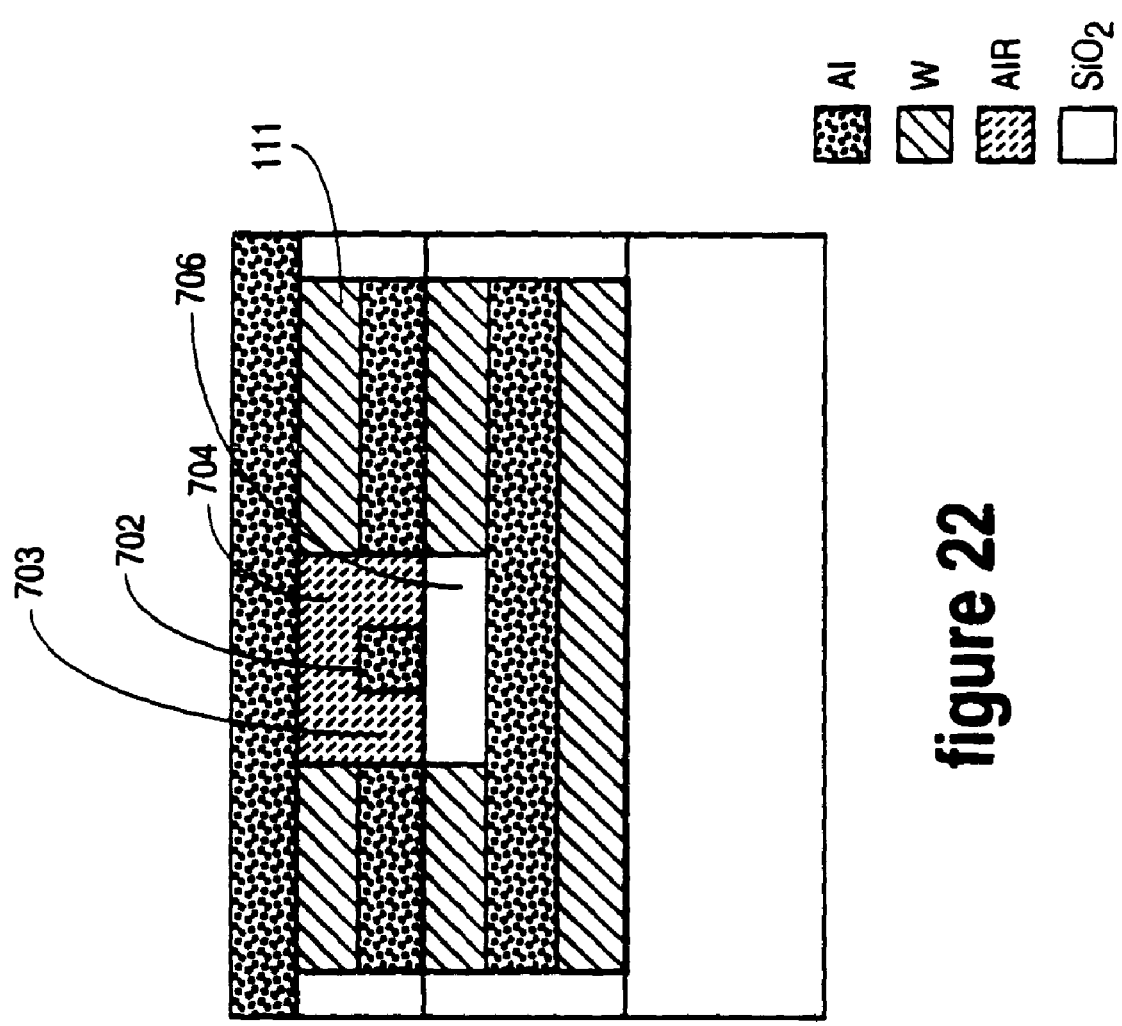
FIG. 22 is an illustration of a pass-thru partially insulated with air.

In FIG. 22 is illustrated an insulated pass-thru 702 in which the pass-thru lead 702 is supported by a dielectric material 706 but the vertical frame pairs 703 and the top frame 704 are spaces (voids) filled with air.

It should also be understood that any number of layers of insulation or metal layers, M1, M2, M3 (metal four, metal five, etc.) may be used to construct multiple pass-thrus on a single level and multiple levels of interconnects and pass-thrus. In addition, for other embodiments, the metal layer deposited to form the lid in the disclosed embodiment may be patterned into interconnect circuitry for devices outside the Faraday cage.

Further, for other embodiments, there may be subsequent layers deposited above a Faraday cage lid to add interconnects, vias, and other Faraday cage walls to circuitry stacked outside and/or higher than a given Faraday cage.

This method of forming the Faraday cage could be employed to construct structures for other applications such as to redirect electrostatic discharge, to distribute thermal energy, or to shield light sensitive devices such as, for example, might be used in optical switching.

We claim:

1. An apparatus comprising:
   a semiconductor device integrally formed within a monocrystalline silicon substrate such that the semiconductor device is a part of the monocrystalline substrate;
   a Faraday cage that encloses said semiconductor device within a structure of metal that has an at least one vertical metal wall, wherein a bottom surface of said Faraday cage is formed on a top surface of said monocrystalline silicon substrate, and said bottom surface of said Faraday cage is below a top surface of said semiconductor device; and
   a patterned insulating layer within the Faraday cage and over the at least one semiconductor device; and
   an interconnect within the Faraday cage and over a top surface of the patterned insulating layer.

2. The apparatus of claim 1, further comprising a second semiconductor device located outside and adjacent to the Faraday cage.

3. The apparatus of claim 1, wherein the at least one vertical metal wall is made from one or more metal layers.

4. The apparatus of claim 1, wherein the interconnect is connected with the at least one semiconductor device and includes input/output leads that pass through the at least one vertical metal wall of the Faraday cage at one or more insulated locations.

5. The apparatus of claim 4, wherein the one or more insulated locations are made from one or more insulating layers.

6. The apparatus of claim 4, wherein the interconnect is constructed with a metal layer that is used to construct the Faraday cage.

7. The apparatus of claim 4, wherein the interconnect is located within the Faraday cage.

8. The apparatus of claim 4, wherein the interconnect is further located outside the Faraday cage.

9. The apparatus of claim 1, further comprising a filled via constructed with a metal layer used to construct the Faraday cage.

10. The apparatus of claim 9, wherein the filled via is located within the Faraday cage.

11. The apparatus on a substrate of claim 9, wherein the filled via is located outside the Faraday cage.

12. The apparatus on a substrate of claim 1, wherein the at least one semiconductor device can be chosen from the group consisting of MOS, CMOS, NMOS, PMOS, Bi-CMOS and DMOS.

13. An apparatus comprising:
   an at least one semiconductor device integrally formed within a monocrystalline silicon substrate such that the semiconductor device is a part of the monocrystalline substrate;
   an at least one patterned insulating layer including a filled via opening positioned over the at least one semiconductor device;
   an at least one metal layer positioned over the at least one insulating layer such that the at least one metal layer forms a first metal cage that encloses the at least one semiconductor device and has at least one vertical metal wall, wherein a bottom surface of said first metal cage is on a top surface of said monocrystalline silicon substrate, and said bottom surface of said first metal cage is below a top surface of said semiconductor device.

14. The apparatus of claim 13, further comprising a second semiconductor device positioned outside and adjacent the first metal cage.

15. The apparatus of claim 13, further comprising:

a second metal cage that encloses a first interconnect and is positioned higher than the first metal cage;

a second interconnect positioned outside the second metal cage;

an at least one set of input/output leads that connect the first interconnect within the second metal cage to the second interconnect positioned outside the second metal cage.

16. An apparatus comprising:

a semiconductor device integrally formed within a semiconductor substrate such that the semiconductor device is a part of the semiconductor substrate; and a Faraday cage that encloses said semiconductor device within a structure of metal, wherein a bottom surface of said Faraday cage is formed on a top surface of said semiconductor substrate, and said bottom surface of said Faraday cage is below a top surface of said semiconductor device.

17. The apparatus of claim 16, further comprising a patterned insulating layer within the Faraday cage and over the at least one semiconductor device.

18. The apparatus of claim 17, further comprising an interconnect within the Faraday cage and over a top surface of the patterned insulating layer.

19. The apparatus of claim 18, wherein said bottom surface of said Faraday cage is below a top surface of said semiconductor device.

20. The apparatus of claim 18, wherein said bottom surface is in direct contact with said top surface of said semiconductor substrate.

* * * * *